United States Patent
Portal et al.

(10) Patent No.: US 12,176,030 B2
(45) Date of Patent: *Dec. 24, 2024

(54) SELF-REFERENCED AND REGULATED SENSING SOLUTION FOR PHASE CHANGE MEMORY WITH OVONIC THRESHOLD SWITCH

(71) Applicants: Universite D'Aix Marseille, Marseilles (FR); Centre National de la Recherche Scientifique, Paris (FR); STMicroelectronics (Crolles 2) SAS, Crolles (FR)

(72) Inventors: Jean-Michel Portal, Saint-Savournin (FR); Vincenzo Della Marca, Marseilles (FR); Jean-Pierre Walder, Marseilles (FR); Julien Gasquez, Echirolles (FR); Philippe Boivin, Venelles (FR)

(73) Assignees: Universite D'Aix Marseille, Marseilles (FR); Centre National de la Recherche, Paris (FR); STMicroelectronics (Crolles 2) SAS, Crolles (FR); STMicroelectronics (Roussel) SAS, Roussel (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/535,335

(22) Filed: Dec. 11, 2023

(65) Prior Publication Data
US 2024/0153557 A1    May 9, 2024

Related U.S. Application Data

(63) Continuation of application No. 17/673,550, filed on Feb. 16, 2022, now Pat. No. 11,875,847.

(51) Int. Cl.
*G11C 13/00* (2006.01)

(52) U.S. Cl.
CPC ........ *G11C 13/004* (2013.01); *G11C 13/0004* (2013.01); *G11C 13/0026* (2013.01);
(Continued)

(58) Field of Classification Search
CPC .............. G11C 13/004; G11C 13/0004; G11C 13/0026; G11C 13/0028; G11C 2013/0054; G11C 2213/72
(Continued)

(56) References Cited

U.S. PATENT DOCUMENTS 8,867,260 B2    10/2014   Huang et al.
11,875,847 B2 *  1/2024   Portal ................ G11C 13/0061

OTHER PUBLICATIONS

Hang-Ting Lue et al, "3D AND: A 3D Stackable Flash Memory Architecture to Realize High-Density and Fast-Read 3D NOR Flash and Storage-Class Memory", IEEE International Electron Devices Meeting (IEDM), 2020.
(Continued)

*Primary Examiner* — Huan Hoang

(57) ABSTRACT

A method for operating a sense amplifier in a one-switch one-resistance (1S1R) memory array, includes: generating a regulated full voltage and a regulated half voltage; applying the regulated full voltage and regulated half voltage to selected and unselected bit lines of the 1S1R memory array during read operations as an applied read voltage; and inducing and compensating for a sneak-path current during read operations by adjusting the applied read voltage based on the cell state of an accessed bit cell and an amplitude of the sneak-path current.

18 Claims, 4 Drawing Sheets

(52) U.S. Cl.
CPC .. *G11C 13/0028* (2013.01); *G11C 2013/0054* (2013.01); *G11C 2213/72* (2013.01)

(58) Field of Classification Search
USPC ..................................................... 365/163
See application file for complete search history.

(56) References Cited

OTHER PUBLICATIONS

Hang-Ting Lue et al, "A Vertical 2T Nor (V2T) Architecture to Enable Scaling and Low-Power Solutions for NOR Flash Technology", IEEE Symposium on VLSI Technology, 2020.

F. La Rosa et al, "40nm embedded Select in Trench Memory (eSTM) Technology Overview", IEEE 11th International Memory Workshop (IMW), 2019.

M. Carissimi et al, "2-Mb Embedded Phase Change Memory With 16-ns Read Access Time and 5-Mb/s Write Throughput in 90-nm BCD Technology for Automotive Applications", IEEE Solid-State Circuits Letters, vol. 2, No. 9, Sep. 2019.

G. Navarro et al, "Highly Sb-Rich Ge—Sb—Te Engineering in 4Kb PhaseChange Memory for High Speed and High Material Stability Under Cycling" IEEE 11th International Memory Workshop (IMW), 2019.

E. Nolot et al, "Germanium, antimony, tellurium, their binary and ternary alloys and the impact of nitrogen: An X-ray photoelectron study", Applied Surface Science, vol. 536, Jan. 2021.

F. Disegni et al, "Embedded PCM macro for automotive-grade microcontroller in 28nm FD-SOI", Symposium on VLSI Circuits, 2019.

M. Laudato et al, "ALD GeAsSeTe Ovonic Threshold Switch for 3D Stackable Crosspoint Memory" IEEE International Memory Workshop (IMW), 2020.

Anthonin Verdy et al, "Improved Electrical Performance Thanks to Sb and N Doping in Se-Rich GeSe-Based OTS Selector Devices", IEEE International Memory Workshop (IMW), 2017.

C. Laguna et al, "Innovative Multilayer OTS Selectors for Performance Tuning and Improved Reliability", IEEE International Memory Workshop (IMW), 2020.

Solomon Amsalu Chekol et al, "Thermally Stable Te-based Binary OTS Device for Selector Application", Non-Volatile Memory Technology Symposium (NVMTS), 2018.

S.R. Ovshinsky, H. Fritzsche, "Amorphous semiconductors for switching, memory, and imaging applications", Transactions on Electron Devices, 1973, vol. 20, issue 2.

A. Verdy et al, "Optimized Reading Window for Crossbar Arrays Thanks to Ge—Se—Sb—N-based OTS Selectors", IEEE International Electron Devices Meeting (IEDM), 2018.

W.C. Chien et al, "Comprehensive Scaling Study on 3D Cross-Point PCM toward 1Znm Node for SCM Applications", Symposium on VLSI Technology, 2019.

Jiwei Li et al, "New write operation scheme for alleviating effect of line resistance on RRAM crossbar array", IEEE Advanced Information Management, Communicates, Electronic and Automation Control Conference (IMCEC), 2016.

A. Levisse et al, "SneakPath compensation circuit for programming and read operations in RRAM-based CrossPoint architectures", 15th NonVolatile Memory Technology Symposium (NVMTS), 2015.

Woorham Bae et al, "A Variation-Tolerant, Sneak-Current-Compensated Readout Scheme for Cross-Point Memory Based", IEEE Transactions on Circuits and Systems II: Express Briefs, vol. 65, No. 12, 2018.

J. Minguet Lopez et al, "Optimization of RRAM and OTS selector for advanced low voltage CMOS compatibility", IEEE International Memory Workshop (IMW), May 2020, Dresden, Germany. pp. 1-4.

Behzad Razavi, "The StrongARM Latch [A Circuit for All Seasons]", IEEE Solid-State Circuits Magazine, vol. 7, No. 2, 2015.

G.Lama et al, "Reliability analysis in GeTe and GeSbTe based phasechange memory 4 kb arrays targeting storage class memory applications", Microelectronics Reliability, vol. 114, Nov. 2020.

Gasquez, J., et al: "A Self-referenced and regulated sensing solution for PCM with OTS selector," 2021, IEEE, 6 pages.

\* cited by examiner

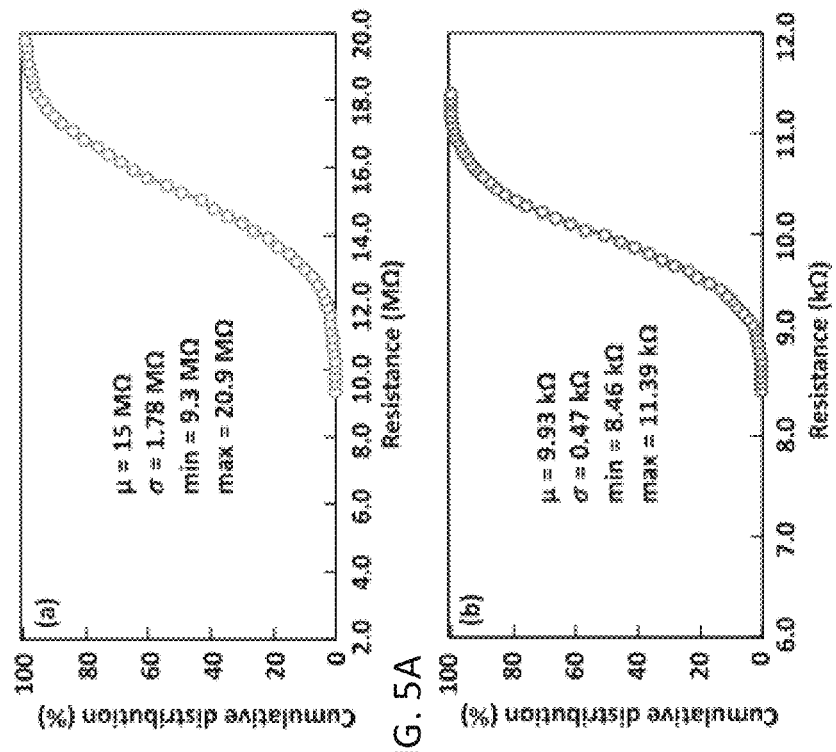
FIG. 5A
FIG. 5B
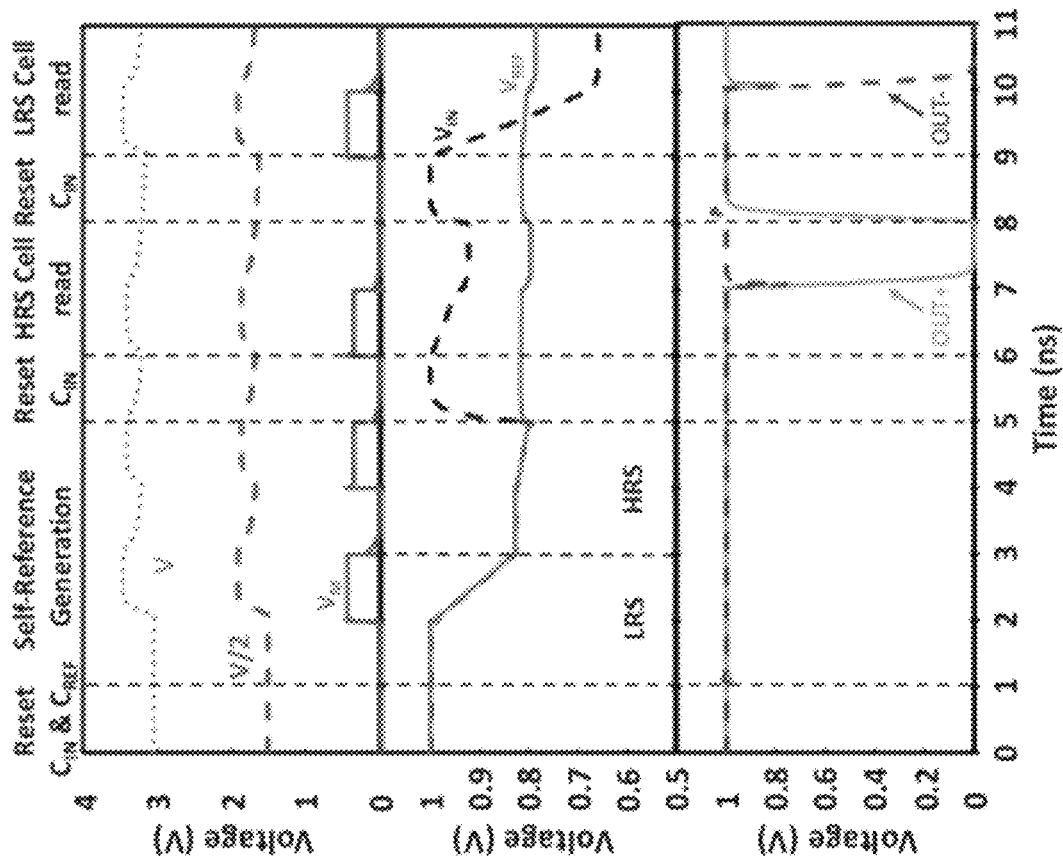
FIG. 4

SELF-REFERENCED AND REGULATED SENSING SOLUTION FOR PHASE CHANGE MEMORY WITH OVONIC THRESHOLD SWITCH

RELATED APPLICATION

This application is a continuation of U.S. application patent Ser. No. 17/673,550, filed Feb. 16, 2022, the contents of which are incorporated by reference to the maximum extent allowable under the law.

TECHNICAL FIELD

This disclosure relates to the field of phase-change memory and, in particular, to a phase-change memory device utilizing ovonic threshold switching (OTS) selectors that has auto-compensation of its sneak-path currents and auto-regulation of its row and column biasing over a wide range of OTS selectivity.

BACKGROUND

Memories are arranged in the form of arrays organized into rows and columns. One useful form of memory is known as phase-change memory. In the context of a phase-change memory cell, rows are formed by word line and columns are formed by bit lines.

Each memory cell of a phase-change memory cell is formed from a layer of phase-change material in contact with a resistive element. Phase-change materials are materials which may switch between a crystal phase and an amorphous phase. The difference in electric resistance between the amorphous phase of the material and its crystal phase is used to define at least two memory states, such as binary 0 and 1. Switching the phase-change material of a phase-change memory cell between the crystal phase and the amorphous phase is caused by heating of the phase-change material. The phase-change material is heated by passing an electrical current through the resistive element of that phase-change memory cell, causing heating of the resistive element and in turn heating of the phase-change material.

The data contained in a phase-change memory cell are read out by measurement of the resistance across the phase-change memory cell. Each phase-change memory cell has a selection element associated therewith that limits current flowing through unselected memory cells, thereby permitting reading of that phase-change memory cell when selected. The selection elements may be transistors, for example.

The rapid evolution of edge computing, including Artificial Intelligence (AI) and data intensive applications, exacerbates the requirements in terms of the performance and memory capacity of such edge devices, for example high-end Micro-Controller Units (MCUs).

In this context, high-density memory based on emerging concepts can be used to replace prior approaches such as one-transistor one-resistance (1T1R) Phase Change Memory (PCM). See, references [1-7] listed elsewhere herein as examples of such emerging concepts.

In this context, to drastically decrease the footprint of the phase-change memory cells, the selection elements may be changed from transistors to other elements. For example, a selector formed from a suitable selector material in a stacked arrangement with the phase-change material and resistive element may be used, such stacked arrangement permitting a high-density memory array to be formed using phase-change memory cells.

By making this change away from a transistor based selector, the resulting embedded device could rely on mature back-end memory solutions, such as a one-resistance (1R) PCM utilizing a single ovonic threshold switching (OTS) selector (1S) such as that taught by references [8-12] listed elsewhere herein to thereby form a one-switch one-resistance (1S1R) memory cell. However, due to process compatibility constraints in an embedded device context, the OTS selector itself may require specific adjustments.

An ovonic threshold switch (OTS) is a two-terminal symmetrical voltage sensitive switching device. An OTS device includes two spacedly-disposed electrodes in contact with a chalcogenide switching material which is used for its electrically-induced switching properties. The electrically-induced switching properties of chalcogenide switching materials are normally described in terms of the variation in current through the material as a function of applied voltage, otherwise known as the I-V (current-voltage) response. The I-V response of chalcogenide switching materials exhibits an electrically-induced switching event in which the chalcogenide switching materials undergo a transformation from a more resistive state (high resistance state) to a more conductive state (low resistance state).

Beyond the features of phase-change memory cells already demonstrated in the cited literature, i.e. a large resistance ratio of $10^3$, a low variability resulting from a bulk phase change (crystalline and amorphous state), a mature process, and a large endurance of $10^9$ [see references 4-7], the performance of memories utilizing OTS selectors is mainly driven by the OTS selectivity. Regarding the OTS selectivity (selectivity being the change in conductivity of the selection material), numerous papers [9][13][14] listed elsewhere herein have reported different levels of performance, with selectivity ranging from $10^3$ to $10^7$.

The impact of the selectivity of the OTS at the memory array level is characterized by the level of the leakage current of the unselected cells during reading and programming (writing) operations. To compensate for the impact of such leakage currents, which may also be referred to as sneak-path currents, some design techniques have been already proposed.

A first type of technique proposed to limit the sneak-path current impact is based on well-chosen biasing conditions applied to the unselected rows or columns in the memory array. Such techniques are referred to as namely V/2 and V/3 biasing solutions, described for example in reference [15] listed elsewhere herein.

A second type of technique is based on sneak-path current measurement during a first pre-programming or pre-reading phase in order to adapt the biasing voltage to compensate for the amount of sneak-path current. This is described for example in reference listed elsewhere herein.

A third type of technique is based on collecting a mean sneak-current sourced from a compensation port and subtracting it from a reference current during the operation. This is described for example in reference listed elsewhere herein.

None of these techniques, however, provide the level of compensation for sneak-path current and the level of regulation of the biasing that is desired for certain application. As such, further development into the area of phase-change memory utilizing ovonic threshold switching selectors is necessary.

SUMMARY

Phase change memory (PCM) devices utilizing Ovonic Threshold Switching (OTS) selectors may be used to fill the gap between dynamic random-access memory (DRAM) and mass storage and may be incorporated in high-end microcontrollers. Since the programming phase efficiency and reading phase efficiency of such devices is directly linked to the leakage current and sneak-path management of the OTS selector, a sense amplifier disclosed herein generates an auto-reference that takes into account the leakage currents of unselected cells and includes a regulation loop to compensate row and column biasing for voltage drop due to read current sensing. This auto-referenced sense amplifier, built utilizing the principle of charge-sharing, may be designed on a 28 nm fully depleted silicon on insulator (FDSOI) technology, and provides robust performance for a wide range of sneak-path currents and consequently for a large range of memory array sizes. Therefore, the auto-reference sense amplifier disclosed herein is suitable for use in embedded memory in high-end microcontroller.

Also disclosed herein is a sense circuit for use with an array of memory cells, the sense circuit including: a regulation circuit configured to receive as input an input voltage, a full read voltage from reading of a selected cell of the array of memory cells, and a fractional read voltage applied to unselected cells of the array of memory cells.

The regulation circuit includes: an input transistor to which a current based upon the input voltage is applied; a first output transistor in a current mirror arrangement with the input transistor; a first diode-coupled transistor coupled between the first output transistor and the full read voltage, wherein a regulated voltage is produced at a gate of the first diode-coupled transistor; a second output transistor in a current mirror arrangement with the input transistor; and a second diode-coupled transistor coupled between the second output transistor and the fractional read voltage, wherein a regulated fractional voltage is produced at a gate of the second diode-coupled transistor. The regulated voltage and the regulated fractional voltage are used in reading of the selected cell of the array of memory cells. A circuit is configured to generate a reference voltage and generate a data output signal based upon a comparison between the reference voltage and the input voltage.

The input transistor may be a first p-channel transistor having its source coupled to a second supply voltage, and having its drain coupled to its gate and having the current based upon the input voltage sunk therefrom.

The first output transistor may be a second p-channel transistor having its source coupled to the second supply voltage, its gate coupled to the gate of the first p-channel transistor, and a drain.

The first diode-coupled transistor may be a first n-channel transistor having its drain coupled to the drain of the second p-channel transistor, its source coupled to the full read voltage, and its gate coupled to its drain and at which the regulated voltage is produced.

The second output transistor may be a third p-channel transistor having its source coupled to the second supply voltage, its gate coupled to the gate of the first p-channel transistor, and a drain.

The second diode-coupled transistor may be a second n-channel transistor having its drain coupled to the drain of the third p-channel transistor, its source coupled to the fractional read voltage, and its gate coupled to its drain and at which the regulated fractional voltage is produced.

A third n-channel transistor may have its drain coupled to the drain of the first p-channel transistor, its gate receiving a bias signal, and a source.

A fourth n-channel transistor may have its drain coupled to the source of the third n-channel transistor, its source coupled to ground, and its gate coupled to the capacitor circuit to receive the input voltage.

Also disclosed herein is a sense circuit for use with an array of memory cells, the sense circuit including: a regulation circuit configured to generate a regulated voltage and a regulated fractional voltage for use in reading a selected cell of an array of memory cells; and a capacitor circuit. The capacitor circuit includes: a current mirror having an input coupled to a bit line of a selected cell of an array of memory cells and an output coupled to a first node; a resettable input capacitor circuit coupled between a first supply voltage and the first node to store the input voltage; a resettable reference capacitor circuit coupled between the first supply voltage and a second node to store a reference voltage; and a transmission gate coupled between the first and second nodes, the transmission gate being controlled by a share control signal. A circuit is configured to generate a data output signal based upon a comparison between the reference voltage and the input voltage.

The resettable input capacitor circuit may include: an input capacitor coupled between the first supply voltage and the first node to store the input voltage; and an input reset transistor coupled between the first supply voltage and the first node, the input reset transistor being controlled by an input reset control signal.

The input capacitor may include a first MOS transistor having its drain/source terminals connected to the first supply voltage and its gate connected to the first node.

The resettable reference capacitor circuit may include: a reference capacitor coupled between the first supply voltage and the second node to store the reference voltage; and a reference reset transistor coupled between the first supply voltage and the second node, the reference reset transistor being controlled by a reference reset control signal.

The reference capacitor may include a second MOS transistor having its drain/source terminals connected to the first supply voltage and its gate connected to the second node.

The current minor may include: a first n-channel transistor having its drain coupled to the first node, its source coupled to ground, and a gate; a second n-channel transistor having its drain coupled to the bit line of the selected cell of the array of memory cells, its source coupled to ground, and its gate coupled to its drain and to the gate of the first n-channel transistor; and a third n-channel transistor having its drain coupled to the gates of the first and second n-channel transistors, its source coupled to ground, and its gate coupled to a control signal.

Also disclosed herein is a sense circuit for use with an array of memory cells, the sense circuit including: a regulation circuit configured to generate a regulated voltage and a regulated fractional voltage for use in reading a selected cell of an array of memory cells; a circuit configured to generate a reference voltage; and a comparator circuit configured to generate a data output signal based upon a comparison between the reference voltage and an input voltage. The comparator circuit includes: a StrongArm comparator having inputs receiving the input voltage and the reference voltage, and generating a positive output and a negative output based upon the comparison between the input voltage and the reference voltage; and an RS flip-flop having a reset input receiving the negative output and a set input receiving the positive output, the RS flip flop having an output at which the data output signal is generated.

The StrongArm comparator may include: a first input transistor coupled between a first node and a tail node, the first input transistor having a control terminal controlled by the input voltage; a second input transistor coupled between a second node and the tail node, the second input transistor having a control terminal controlled by the reference voltage; a first transistor coupled between a first supply voltage and the positive output, the first transistor having a control terminal coupled to the negative output; a second transistor coupled between the positive output and the first node, the second transistor having a control terminal coupled to the negative output; a third transistor coupled between the first supply voltage and the negative output, the third transistor having a control terminal coupled to the positive output; and a fourth transistor coupled between the negative output and the second input, the fourth transistor having a control terminal coupled to the positive output.

The first input transistor may be an n-channel transistor having a drain connected to the first node, a source connected to the tail node, and a gate connected to the input voltage.

The second input transistor may be an n-channel transistor having a drain connected to the second node, a source connected to the tail node, and a gate connected to the reference voltage.

The first transistor may be a p-channel transistor having a source connected to the first supply voltage, a drain connected to the positive output, and a gate connected to the negative output.

The second transistor may be an n-channel transistor having a drain connected to the positive output, a source connected to the first node, and a gate connected to the negative output.

The third transistor may be a p-channel transistor having a source connected to the first supply voltage, a drain connected to the negative output, and a gate connected to the positive output.

The fourth transistor may be an n-channel transistor having a drain connected to the negative output, a source connected to the second node, and a gate connected to the positive output.

The StrongArm comparator may further include: a first enable transistor coupled between a first supply voltage and the positive output, the first enable transistor having a control terminal controlled by an enable signal; and a second enable transistor coupled between the first supply voltage and the negative output, the second enable transistor having a control terminal controlled by the enable signal.

Also disclosed herein is a method for operating a sense amplifier in a one-switch one-resistance (1S1R) memory array, including: generating a regulated full voltage and a regulated half voltage from a high voltage; applying the regulated full voltage and regulated half voltage to selected and unselected bit lines of the 1S1R memory array during read operations as an applied read voltage; and inducing and compensating for sneak-path current during read operations by adjusting the applied read voltage based on the cell state of an accessed bit cell and an amplitude of the sneak-path current.

The method may further includes: implementing self-reference generation within the sense amplifier via charge sharing between input and reference capacitors; adjusting voltage on the input capacitor based on a read current of the accessed bit cell and the sneak-path current; generating a dynamic reference voltage from the reference capacitor after the charge sharing, the dynamic reference voltage being based upon average conditions of the memory array, accounting for influences including the sneak-path current and temperature drift; and comparing the voltage on the input capacitor, as adjusted, with the dynamically generated reference voltage to accurately determine data output of the accessed bit cell.

Generating the regulated full voltage from the high voltage may be performed using a first transistor and a first amplifier in a voltage regulator arrangement, and generating the regulated half voltage may be performed using a second transistor and a second amplifier in a voltage regulator arrangement.

The regulated full voltage and the regulated half voltage may be applied to the selected and unselected bit lines of the 1S1R memory array during read operations by: routing the regulated full voltage and the regulated half voltage to a bit line multiplexer with multiple outputs corresponding to different bit lines of the 1S1R memory array; connecting a first input of the bit line multiplexer to receive the regulated full voltage and the second input to receive the regulated half voltage; and using a control word from a bit line decoder to control the bit line multiplexer to selectively pass the regulated full voltage to the selected bit line as indicated by the control word, while applying the half voltage to the remaining unselected bit lines, thereby achieving the desired biasing during the read operations.

The comparison of the voltage on the input capacitor with the dynamically reference voltage may be performed using a StrongArm comparator.

BRIEF DESCRIPTION OF THE DRAWINGS

FIG. 4 are graphs showing the sense operation of the memory device of FIG. 1, with the self-reference generation (performed by resetting the input and reference capacitors and generating the voltage references), followed by the sensing of a cell in a high resistance state and the sensing of a LRS cell. The graphs also show the regulated signals.

FIG. 5A is a graph showing the equivalent resistance cumulative distribution of the memory device of FIG. 1, illustrating OTS and PCM variability with the OTS in off state during the read operation of a PCM in the high resistance state.

FIG. 5B is a graph showing the equivalent resistance cumulative distribution of the memory device of FIG. 1, illustrating OTS and PCM variability and with the OTS in on state during the read operation of a PCM in the low resistance state.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated, and is not a parasitic unless the contrary is stated. Moreover, any described inductor or inductance is a discrete device unless the contrary is stated, and is not a parasitic unless the contrary is stated.

In memory array formed from one-switch one-resistance (1S1R) memory cells (which may also be referred to as bit cells) which utilize a half biasing strategy during read operations, the bit cells sharing the same column and same row as the bit cell being read are half biased, meaning that the bit line and word line of the bit cell being read have a full biasing voltage therebetween V but the other bit lines and word lines have a half biasing voltage V/2 applied therebetween. This induces sneak-path currents. The resulting row sneak-path current uses additional current over than the current needed to read the selected bit cell, resulting in an increase in the risk of dropout of the read voltage V. The resulting column sneak-path current adds an extra-current to the current flowing through the accessed memory cell, resulting in a risk of blurring the bit cell read current.

Both sneak-path currents depend on the selectivity of the OTS selector within the bit cells as well as the size of the memory array. Consequently, the 1S1R memory device disclosed herein includes the capability of the regulation of the applied read voltage V on the selected bit lines and the applied read voltage V/2 on the unselected bit lines to compensate for the large read current due to the sneak-path current and read current above the hold current of the OTS selector. See reference listed elsewhere herein for details on the sneak-path currents, read currents, and hold currents of OTS selectors. The 1S1R memory device disclosed herein also has the capability to compensate the sneak-path current to isolate the contribution of the read current crossing the accessed bit cell.

Figure 1:
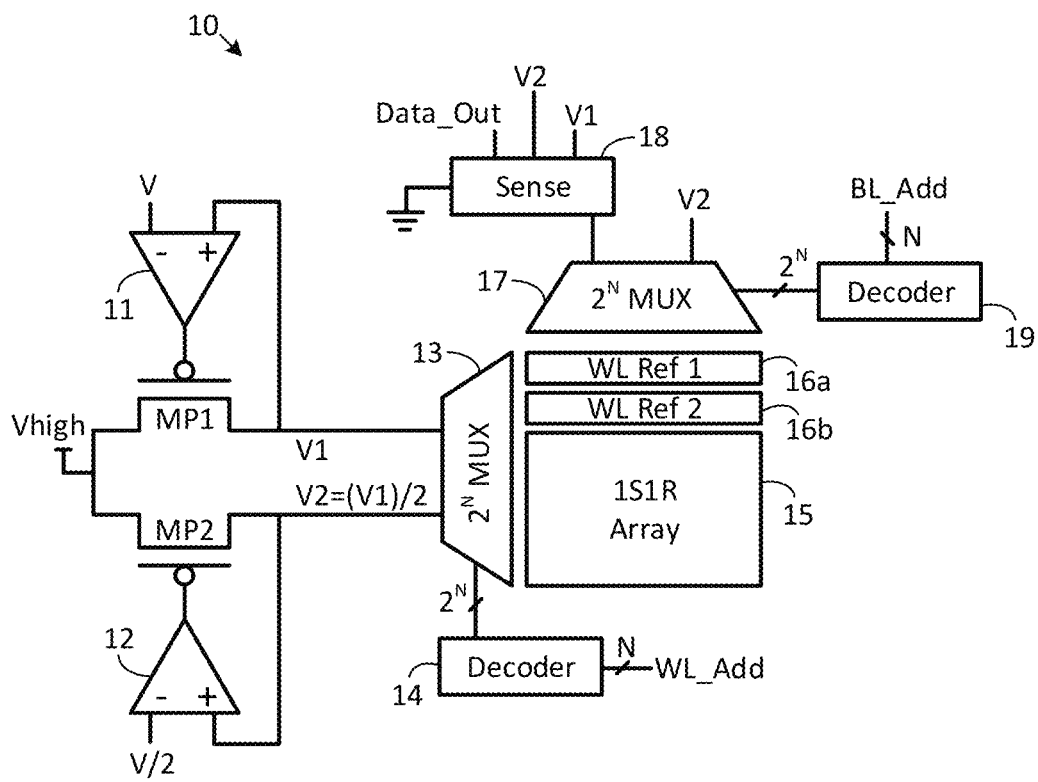
FIG. 1 is a block diagram of a memory device disclosed herein.

The 1S1R memory device 10 disclosed herein is now described with reference to FIG. 1. The 1S1R memory device 10 includes an array 15 of $2^{2N}$–$2\times2^N$ one-switch one-resistance (1S1R) memory cells divided into rows (word lines) and columns (bit lines). There are two reference rows 16a and 16b located at the periphery of the array 15. Each reference row is formed of 1S1R cells placed into alternating states (alternating between the high resistance state and the low resistance state), with the states of adjacent 1S1R cells between the two reference rows being complementary to one another. As an example, the first cell of the first reference row 16a may be in the low resistance state, the second cell of the first reference row 16a may be in the high resistance state, and the third cell of the first reference row 16a may be in the low resistance state, while the first cell of the second reference row 16b is in the high resistance state, the second cell of the second reference row 16b is in the low resistance state, and the third cell of the second reference row 16b is in the high resistance state.

A word line multiplexer 13 has two inputs and $2^N$ outputs, each output being connected to a different word line. The first input of the word line multiplexer 13 is connected to receive a voltage V, and the second input of the word line multiplexer 13 is connected to receive a voltage V/2. The word line multiplexer 13, in operation under control of a first $2^N$ bit control word received from a decoder 14, passes the voltage at its first input to a selected one of its $2^N$ outputs indicated by the first $2^N$ bit control word and passes the voltage at its second input to the unselected ones of its $2^N$ outputs indicated by the first $2^N$ bit control word (the unselected outputs being those not indicated by the first $2^N$ bit control word to receive the voltage at the first input).

The voltage V is generated as being a regulated voltage by a p-channel transistor MP1 having its source connected to a supply voltage Vhigh, its drain connected to the first input of the word line multiplexer 13, and its gate controlled by an amplifier 11. The amplifier 11 has its non-inverting terminal connected to receive a voltage V, its inverting terminal connected to the drain of transistor MP1, and its output connected to the gate of transistor MP1. The amplifier 11 regulates the gate voltage of transistor MP1 such that the voltage V at the drain of MP1 is maintained.

The voltage V/2 is generated as being a regulated voltage by a p-channel transistor MP2 having its source connected to a supply voltage Vhigh, its drain connected to the second input of the word line multiplexer 13, and its gate controlled by an amplifier 12. The amplifier 12 has its non-inverting terminal connected to receive a voltage V/2, its inverting terminal connected to the drain of transistor MP2, and its output connected to the gate of transistor MP2. The amplifier 12 regulates the gate voltage of transistor MP2 such that the voltage V/2 at the drain of MP2 is maintained.

The decoder 14 receives an N-bit word line address WL_Add indicating which word line of the 1S1R array 15 is to be selected, decodes that word line address, and generates the first $2^N$ bit control word as described above.

A bit line multiplexer 17 has two inputs and $2^N$ outputs, each output being connected to a different bit line. The first input of the bit line multiplexer 17 is connected to a sense amplifier 18 to receive a read voltage Vm therefrom, and the second input of the bit line multiplexer 17 is connected to receive V/2. The bit line multiplexer 17, in operation under control of a second $2^N$ bit control word received from a decoder 19, passes the voltage at its first input to a selected one of its $2^N$ outputs indicated by the second $2^N$ bit control word and passes the voltage at its second input to the unselected ones of its $2^N$ outputs indicated by the second $2^N$ bit control word (the unselected outputs being those not indicated by the second $2^N$ bit control word to receive the voltage at the first input).

The decoder 19 receives an N-bit bit line address BL_Add indicating which bit line of the 1S1R array 15 is to be selected, decodes that bit line address, and generates the second $2^N$ bit control word as described above.

The voltage Vm is the read voltage, and is generated by a sense amplifier 18, which will be described in greater detail below. The sense amplifier 18 has four terminals in addition to a ground terminal. The first terminal of the sense amplifier 18 provides the voltage V, the second terminal of the sense amplifier 18 provides the voltage V/2, a third terminal of the sense amplifier 18 outputs a data output signal Data_Output, and a fourth terminal of the sense amplifier 18 is connected to the first input of the bit line multiplexer 17.

The voltage $V_M$ is the resulting voltage induced by MN2. It allows the copying of the current in MN4 and MN11, but hinders the provision of a strict ground voltage to the bottom electrodes of the selected cell of the memory 15. The adding of the voltage $V_M$ on the top electrode of the selected cell by the feedback loop resulting in the setpoints $V=V_{read}+V_M$ and $V/2=V_{read}/2\pm V_M$. V and V/2 are the setpoints of the LDOs 11 and 12.

The sense amplifier 18, as will be described below, knowing the read voltage $V_M$ to be applied, includes a regulator loop that compensates the read voltage applied to the selected bit line for drop due to current sensing of the data output signal Data_Out. The compensation applied is dependent upon the cell state of the accessed bit cell as well as the amplitude of the sneak-path current.

Figure 2:
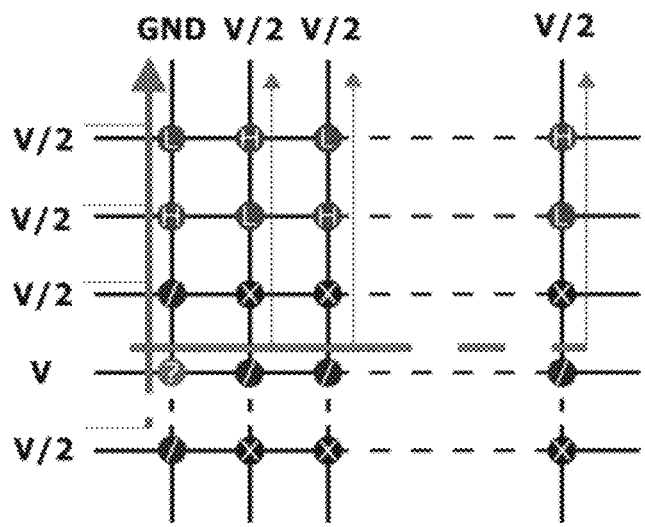
FIG. 2 is a diagram showing row and column sneak-paths of the memory array of FIG. 1 during reading operations.

With additional reference to FIG. 2, in general, the principle is to maintain the applied voltage $V-V_M$ on the selected cell as being constant regardless of variation in $V_M$. Since $V_M$ is a few mV apart from ground, $V_M$ is added to $V_{read}$ in order to obtain $V=V_{read}+V_M$ and $V/2=V_{read}/2+V_M$.

The reference rows 16a, 16b are utilized in an operation to sense, prior to the selected cell of a given column, both reference cells 16a, 16b sharing the selected column. This preserves the sneak-path current, enabling generation of a voltage reference that cancels the sneak-path current. The reference generation is built using the principle of charge sharing and is performed in three functional phases. During the first phase, a sense input capacitor is charged using the low resistance state 1S1R reference cell resulting in a capacitor-voltage given by:

$$V_{in} = \frac{(I_{LRS} + I_{sneak}) \cdot T}{C} \quad (1)$$

In equation (1), T is the charging time, C is the capacitance of the sense input capacitor, $I_{LRS}$ is the current through the corresponding cell in the reference row 16a, 16b in the low resistance state, and $I_{sneak}$ is the sneak-path current of the selected column.

During the second phase, the sense input capacitor is further charged using the corresponding cell in the reference row 16a, 16b in the high resistance state, resulting in a new capacitor-voltage given by:

$$V_{in} = \frac{(I_{LRS} + I_{sneak} + I_{HRS} + I_{sneak}) \cdot T}{C} \quad (2)$$

In equation (2), $I_{HRS}$ is the current through the cell in the reference row 16a, 16b in the high resistance state.

In the third phase, a charge sharing process occurs, using a reference capacitor having a capacitance equal to the capacitance of the input capacitor C. Doing so, the reference voltage $V_{ref}$ is determined by:

$$V_{ref} = \frac{\left(\frac{I_{LRS} + I_{HRS}}{2} + I_{sneak}\right) \cdot T}{C} \quad (3)$$

Therefore, when reading the selected cell, the voltage on the input capacitor is determined by:

$$V_{in} = \frac{(I_{CELL} + I_{sneak}) \cdot T}{C} \quad (4)$$

Given that C and T are the same in equations (3) and (4), it is evident that the sneak current is compensated and that $I_{CELL}$ (the selected cell current) is compared solely to $$\frac{I_{LRS} + I_{HRS}}{2}$$

Note that temperature drift in the selected cell is compensated by this self-reference generation.

Figure 3:
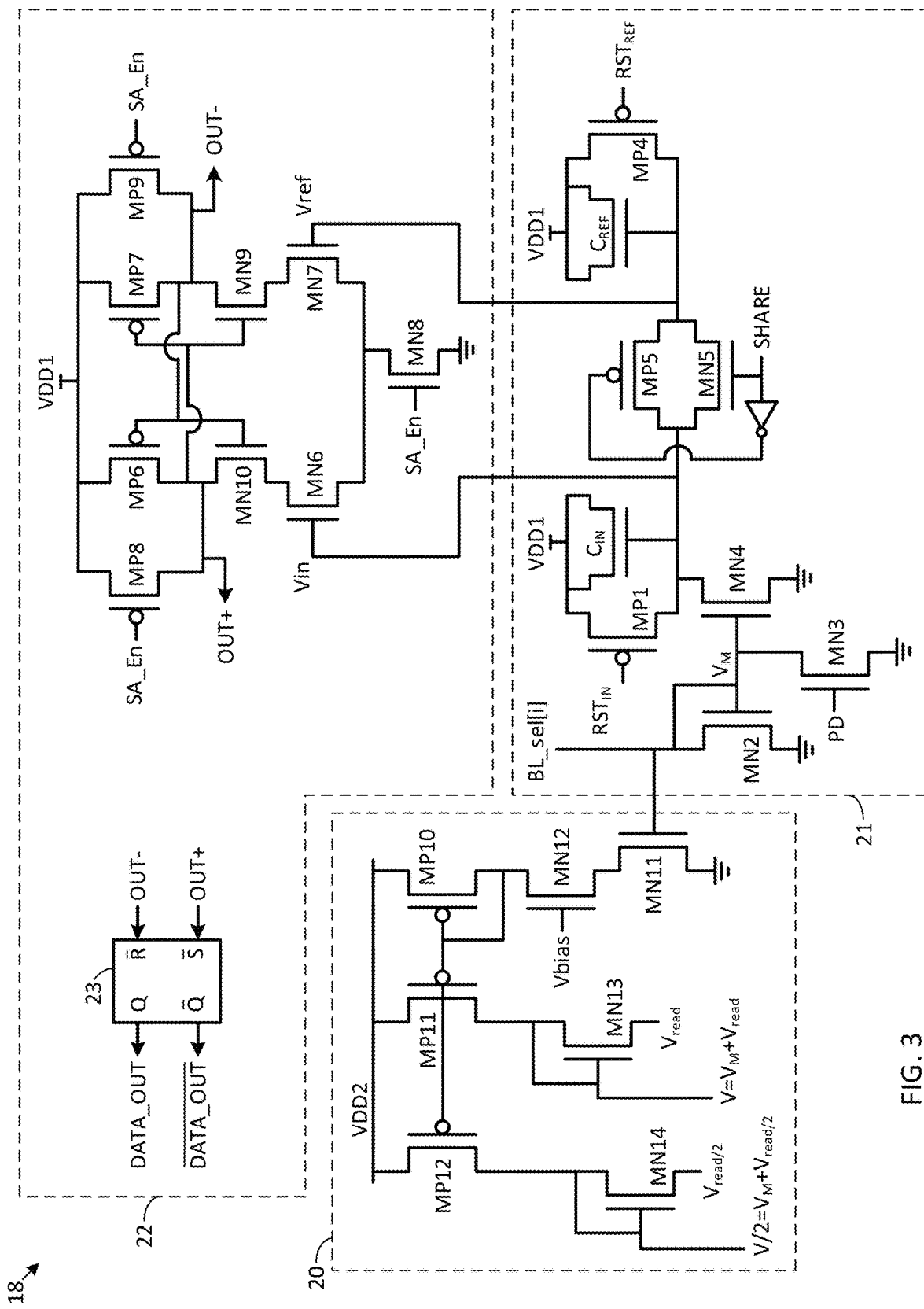
FIG. 3 is a schematic block diagram of the sense amplifier of memory device of FIG. 1.

The specifics of the sense amplifier 18 will now be described with reference to FIG. 3. The sense amplifier 18 includes a regulation circuit 20 which generates the voltage V and V/2 used as input to the amplifiers 11 and 12, a capacitor block 21 which performs auto-reference generation through charge sharing, and a comparator block 22 which produces the data output signal Data_Out.

The regulation circuit 20 includes p-channel transistors MP10, MP11, and MP12 in a current minor arrangement. The transistor MP12 has its source connected to a supply voltage VDD2, its drain connected to the drain of n-channel transistor MN14, and its gate connected to the gates of transistors MP11 and MP10. The transistor MP11 has its source connected to the supply voltage VDD2, its drain connected to the drain of n-channel transistor MN13, and its gate connected to the gates of transistors MP12 and MP10. The transistor MP10 has its source connected to the supply voltage VDD2, its drain connected to the drain of n-channel transistor MN12 and the gates of MP10, MP11, and MP12, and its gate connected to the gates of transistors MP12 and MP11. The n-channel transistor MN14 has its drain connected to the drain of transistor MP12, its source connected to one half of the read voltage $V_{read}/2$, and its gate connected to its drain and outputting the voltage V/2. The n-channel transistor MN13 has its drain connected to the drain of transistor MP11, its source connected to the read voltage $V_{read}$, and its gate connected to its drain and outputting the voltage V. The n-channel transistor MN12 has its drain connected to the drain of transistor MP10, its source connected to the drain of n-channel transistor MN11, and its gate connected to a bias voltage Vbias. The n-channel transistor MN11 has its drain connected to the drain of transistor MN12, its source connected to ground, and its gate connected to the drain of n-channel transistor MN2 of the capacitor block 21 to receive the voltage $V_M$.

The regulation circuit 20 copies the voltage $V_M$ and adds its value during the current sensing, including cell current $I_{CELL}$ and sneak-path current $I_{sneak}$, on both input voltages $V_{read}$ and $V_{read}/2$, to generate the voltages V and V/2 as being:

$V=V_M+V_{read}$, and $V/2=V_M+V_{read}/2$

During the current sensing, since the current might be high, $V_M$ is increasing, thus the biasing applied across memory array rows and columns is to be modified to stop collapsing of the applied voltage across the selected cell. Transistor MN12 safeguards transistor MN11 from high swing voltage and utilizes adequate biasing for quick regulation. Transistors MP10, MP11, and MP12 form a current minor as explained, and transistors MN13 and MN14 act as an active charge in order to create the set points.

The capacitor block 21 includes the n-channel transistor MN2 having its drain connected to the gate of n-channel transistor MN11, its source connected to ground, and its gate coupled to its drain as well as to the gate of n-channel transistor MN4 and the drain of n-channel transistor MN3. N-channel transistor MN3 has its drain connected to the gates of n-channel transistors MN2 and MN4, its source connected to ground, and its gate connected to a signal PD. N-channel transistor MN4 has its drain connected to the drain of p-channel transistor MP1, its source connected to ground, and its gate connected to the gate of transistor MN2 and the drain of transistor MN3. P-channel transistor MP1 has its source connected to the input capacitor $C_{IN}$, its drain connected to the drain of transistor MN4, and its gate connected to an input signal $RST_{IN}$. The input capacitor $C_{IN}$ is formed from an n-channel transistor having its source and drain connected to a supply voltage VDD1 and its gate connected to the drain of transistor MN4. A transmission gate is formed by p-channel transistor MP5 and n-channel transistor MN5, with the control signal SHARE operating to activate the transmission gate. A p-channel transistor MP4 has its source connected to the reference capacitor $C_{REF}$, its drain connected to the transmission gate formed by MP5/MN5, and its gate connected to receive a control signal $RST_{REF}$. The reference capacitor $C_{REF}$ is formed by an n-channel transistor having its source and drain connected to the supply voltage VDD1 and its gate connected to the drain of transistor MP4.

The input voltage Vin is produced at the drain of the p-channel transistor MP1 and the reference voltage $V_{ref}$ is produced from the drain of the p-channel transistor MP4.

The principle of current acquisition is based on the voltage discharge of the input capacitor $C_{IN}$ through the current mirror formed by transistors MN2 and MN4. Thus, prior to current acquisition, input capacitor $C_{IN}$ is charged to VDD1 through transistor MP1 by pulling the signal RST IN down. In a similar way, before reference voltage generation, through sharing activation (where the signal SHARE='1'), the reference capacitor $C_{REF}$ is charged to VDD1 through transistor MP4 by pulling the signal $RST_{REF}$ down. The transistor MN3 acts as a pull-down transistor to help ensure that transistor MN4 is in cut-off during two current acquisition phases in order to prevent disturbing of the voltage stored on the capacitor $C_{IN}$. Charge sharing between $C_{IN}$ and $C_{REF}$ is effectuated by the transmission gate formed by transistors MN5/MP5 controlled by the signal SHARE (where the signal SHARE='1').

The comparator block 22 is formed by a StrongARM comparator formed by transistors MN6, MN7, MN9, MN10, MP6, MP7, MP8, and MP9. N-channel transistor MN6 has its drain connected to the source of n-channel transistor MN10, its source connected to the drain of n-channel transistor MN8, and its gate connected to the input voltage Vin. N-channel transistor MN10 has its drain connected to the drain of p-channel transistor MP6, its source connected to the drain of n-channel transistor MN6, and its gate connected to the gate of p-channel transistor MP6. P-channel transistor MP6 has its source connected to the supply voltage VDD1, its drain connected to the drain of n-channel transistor MN10, and its gate connected to the gate of transistor MN10 and to the drain of p-channel transistor MP7 and n-channel transistor MN9. P-channel transistor MP8 has its source connected to the supply voltage VDD1, its drain connected to the drain of p-channel transistor MP6, and its gate connected to an enable signal SA_En. An OUT+ signal is produced at the drain of transistor MP8.

N-channel transistor MN7 has its drain connected to the source of n-channel transistor MN9, its source connected to the drain of n-channel transistor MN8, and its gate connected to the reference voltage $V_{ref}$. N-channel transistor MN9 has its drain connected to the drain of p-channel transistor MP7, its source connected to the drain of n-channel transistor MN7, and its gate connected to the gate of p-channel transistor MP7. P-channel transistor MP7 has its source connected to the supply voltage VDD1, its drain connected to the drain of n-channel transistor MN9, and its gate connected to the gate of transistor MN9 and to the drain of p-channel transistor MP6 and n-channel transistor MN10. P-channel transistor MP9 has its source connected to the supply voltage VDD1, its drain connected to the drain of p-channel transistor MP7, and its gate connected to an enable signal SA_En. An OUT-signal is produced at the drain of transistor MP9.

An RS flip-flop 23 has its R-input receiving the OUT− signal, its S-input receiving the OUT+ signal, and provides the data output signal Data_Out at its non-inverting output and a complement $\overline{Data\_Out}$ of the data output signal Data_Out at its inverting output. The data output signal Data_Out is therefore a result of the comparison of the input voltage Vin to the reference voltage $V_{ref}$ by the StrongARM comparator.

The sense amplifier 18 may be fabricated using 28 nm FDSOI technology, with VDD1 being a low supply voltage equal to 1.0V and VDD2 being a middle supply voltage equal to 5.5V. FIG. 4 illustrates the self-reference generation followed by a read operation on a bit cell that is in the high resistance state, and a read operation performed on a bit cell that is in the low resistance state.

The self-reference generation takes three phases, whereas successive read operations take two phases each. Note that to ease readability of FIG. 4, the representation addressing changes, row selection, and column multiplexer activation has been set to 1 ns. Of course, addressing timing may vary accordingly to the memory array size and the memory controller features, when the sense amplifier 18 is embedded in a full memory chip (not shown). Also, here, capacitor discharge is shown and not capacitor charging.

During the first phase, the sense amplifier 18 is disconnected from the memory array, and the signal PD is asserted while the reset signals $RST_{IN}$ and $RST_{REF}$ rise to a low value to turn on transistors MP1 and MP4 to thereby charge the input capacitor $C_{IN}$ and reference capacitor $C_{REF}$ to VDD1. Thus, $V_{IN}=V_{REF}=VDD1$.

In fact, the signal PD is asserted when the sense amplifier 18 is disconnected from the memory array 15. After this first phase, the self-reference generation process starts with the selection of the low resistance cell reference within the reference row 16a or 16b, and thereafter proceeds to the selection of the high resistance cell reference within the reference row 16a or 16b. During this these selections, the signal SHARE is asserted, and therefore charge is shared between $C_{IN}$ and $C_{REF}$—thus, charge sharing occurs during the reading of the low resistance and high resistance cell references.

Thereafter, during the second phase, the sense amplifier 18 is connected to the memory array 15 by signal PD being deasserted while the signal SHARE remains asserted, and the capacitors $C_{IN}$ and $C_{REF}$ as discharged through the action of transistor MN4 to the following voltage:

$$\frac{I_{LRS} + I_{HRS}}{2} = Vref = VDD1 - \frac{(I_{LRS} + I_{sneak}) \cdot T}{2 \cdot C} \quad (5)$$

Since the read current $I_{LRS}$ plus the sneak-path current $I_{sneak}$ are absorbed through this action, the potential $V_M$ rises and is to be added to the voltages V and V/2 as described.

After this second phase, the sense amplifier 18 is disconnected from the memory array by asserting the signal PD and the appropriate high resistance state cell reference within the reference rows 16a or 16b is addressed. When the signals are stabilized within the memory array 15, the sense amplifier 18 is then reconnected to the memory array 15 by deasserting the signal PD, and the SHARE signal is asserted, beginning the third phase.

During the third phase, the capacitors $C_{IN}$ and $C_{REF}$ are again discharged through the action of transistor MN4 to the following voltage:

$$\frac{I_{LRS} + I_{HRS}}{2} = Vref = VDD1 - \frac{(I_{LRS} + I_{HRS} + 2 \cdot I_{sneak}) \cdot T}{2 \cdot C} \quad (6)$$

This third phase therefore creates a reference voltage image of the mean of the $I_{LRS}$ and $I_{HRS}$, including the sneak-path current $I_{sneak}$ of the accessed column. While the self-reference generation takes three phases, after that, the input capacitor $C_{IN}$ is charged to VDD1 and discharged accordingly to the state of the cell to be read, in two phases, while the reference capacitor $C_{REF}$ is maintained at its value without charging or discharging.

Another advantage of this auto-referencing is that after reference generation and until the leakage current of the transistors MP4, MP5, MN7, MN5 degrades the reference voltage $V_{REF}$, numerous reading phases can be performed on the cells of the same column in a burst mode, before refreshing the reference voltage.

Before a read operation after the third place, the SHARE signal is deasserted and the input capacitor $C_{IN}$ is reset by asserting the $RST_{IN}$ signal.

During the first phase of a read operation, the input voltage $V_{IN}$ is initialized to VDD1. In the second phase of the read operation, the sense amplifier 18 is connected to the memory array 15 and the input capacitor $C_{IN}$ is discharged by the read current $I_{READ}$ as per the state of the addressed cell, while considering the sneak-path current $I_{sneak}$.

Depending on the state of the addressed cell, the voltage $V_{IN}$ is above (in the case the addressed cell is in the high resistance state) or below (in the case the addressed cell is in the low resistance state) the voltage reference $V_{REF}$. The comparator 18 is then activated, latching the output on the two internal nodes OUT+ and OUT−. The auto-regulation process described above is active during the second phase of this read operation.

In an embodiment, the sizing of the components within the sense amplifier may be defined to target 10 µA of sneak-path current, corresponding to the OTS characteristics reported in reference listed elsewhere herein and considering a 1 megabit memory array. The signal timings are those ones presented in FIG. 4. The energy consumption of the sense amplifier has been determined for the nominal case, per block and per operation (self-reference generation, high resistance state cell read, and low resistance state cell read), as shown in Table I. Since a large current is involved during reference generation and the low resistive state cell read, these operations are the most energy consuming. The regu-lation loop is the main contributor, whereas the consumption of the two other blocks remains below the tens of femtojoules.

TABLE I

Sense Amplifier Energy Consumption

| Blocks | Reference Generation | High resistance state cell read | Low resistance state cell read |
|---|---|---|---|
| Regulation | 1.465 pJ | 384 fJ | 1.28 pJ |
| Capacitors | 16.6 fJ | 1.05 fJ | 15.2 fJ |
| Comparator | 0.052 fJ | 0.3 fJ | 0.68 fJ |
| Total | 1.48 pJ | 385.4 fJ | 1.3 pJ |

To help demonstrate the robustness of the sense amplifier described herein, a set of simulations has been performed to take into account process, voltage, and temperature variations. Voltage variations are set to −10%, nominal, and +10% of the supply voltage VDD1, thereby defining three corner cases: 0.9V, 1V, and 1.1V. The operating temperature variations are also defined with three corner cases: −55° C., 27° C., and 125° C. Thus, validation of the sense amplifier described herein has been performed against this set of nine corner cases.

For process variations, global as well as local sources of variability are considered at ±3σ, including mismatch on the typical process corner, considering the implementation of a common centroid and inter-digitized layout in order to reduce the mismatch between the input and reference capacitors and the StrongArm comparator. For simulated voltage and temperature corners, 1000 runs are performed to take into account the process variations. Regarding the OTS and phase change memory variability, the dispersion reported in reference [18] listed elsewhere herein for the OTS and in reference listed [20] elsewhere herein for the phase change memory cell respectively has been extracted. From these extractions and knowing that during a read operation on a phase change memory cell in the low resistance state with the OTS selector being on and a phase change memory cell in the high resistance state with the OTS selector being off, a Gaussian distribution whose mean value is 9.931kΩ and standard deviation is equal to 470Ω and another Gaussian distribution whose mean value is 15MΩ and standard deviation is equal to 1.78MΩ, as shown in FIGS. 5A-5B, are respectively considered.

Figure 6A:
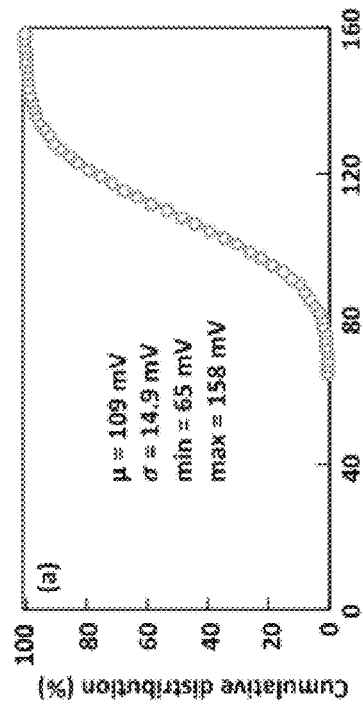
FIG. 6A is a graph showing the margin window cumulative distribution for a read operation on a PCM in the memory device of FIG. 1 in the high resistance state.

Shown in FIG. 6A is the margin window ($V_{IN}$–$V_{REF}$) between the input capacitor $C_{IN}$ voltage $V_{IN}$ and the reference capacitor $C_{REF}$ voltage $V_{REF}$, considering the 9 Voltage-Temperature corners and with 1000 Monte Carlo runs for each corner, in the case of a read operation on a phase change memory cell in the high resistance state (noted $V_{IN\_HRS}$).

Figure 6B:
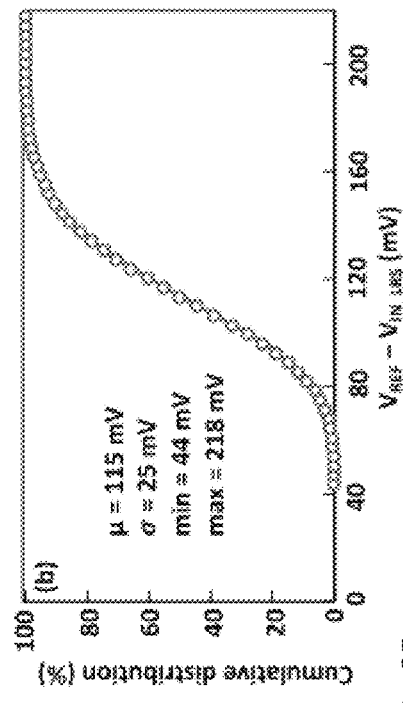
FIG. 6B is a graph showing the margin window cumulative distribution for a read operation on a PCM in the memory device of FIG. 1 in the low resistance state.

Likewise, FIG. 6B reports the margin window ($V_{REF}$–$V_{IN}$) in the same conditions, but for a read operation on a phase change memory cell in the low resistance state (noted $V_{IN\_LRS}$). Both margin windows exhibit a positive value of 65 mV and 44 mV, validating the robustness of the sense amplifier. This robustness is due to the auto-reference generation, compensating for worst-case variations.

Keeping the same sizing and timing constraints, the sense amplifier disclosed herein is also evaluated versus different levels of sneak-path current to assess the robustness of the design with different OTS selector characteristics and different array sizes. The evaluated conditions are reported in Table II with for each pair of OTS selector characteristic/array size, the corresponding theoretical sneak-path current.

TABLE II

| | Sneak-Path Current $I_{sneak}$ | | | |
|---|---|---|---|---|
| | N × N array size | | | |
| $I_{sneak[i]}$(A) at V/2 | 10 kb | 1 Mb | 100 Mb | 3.2 Gb |
| OTS from [13] | 10 nA | 100 nA | 1 µA | 6 µA |
| OTS from [18] | 1 µA | 10 µA | 100 µA | 600 µA |
| OTS from [14] | 50 µA | 500 µA | NA | NA |

In this analysis, sneak-path currents above 1 mA have been discarded as non-realistic values in the memory design-space exploration (e.g., discarded values replaced with NA in Table II). The sneak-path current is calculated as follow:

$$I_{sneak} = \Sigma_{row=0}^{n-1} I_{sneak[i]} \quad (7)$$

Figure 7:
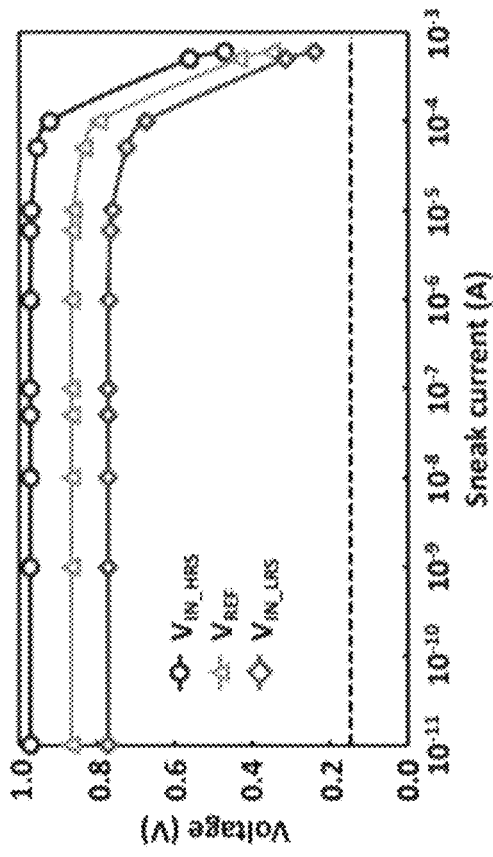
FIG. 7 is a graph showing evolution of the input voltage $V_{IN}$ (corresponding to the read of a PCM in the high resistance state and a PCM in the low resistance state) and voltage reference $V_{REF}$ evolution versus the identified conditions given Table II for various OTS selector characteristics and array sizes.

$I_{sneak[i]}$ is a single cell sneak-current when the OTS selector is biased at V/2 and n is the number of rows in the memory array. Values for a typical case are shown in FIG. 7 with the input voltage $V_{IN}$ for a read operation on a phase change memory cell in the high resistance state (noted $V_{IN\_HRS}$) and for a read operation on a phase change memory cell in the low resistance state (noted $V_{IN\_LRS}$), and the reference voltage $V_{REF}$ versus the sneak-path current from Table II. Notice that the auto-reference generation is efficient for a broad range of sneak-path current. Indeed, for a sneak-path current ranging up to 600 µA, the reference voltage level is well balanced in between the low resistance state voltage level and the resistance state voltage level. However, due to the sizing of the capacitor block (reference 21 in FIG. 3), when the input current overcomes a given limit (around a few hundred µA), two effects can be observed. The first one is a large potential capacitor-discharge, with possibly the input voltage $V_{IN}$ and the reference voltage $V_{REF}$ being close to the NMOS threshold voltages (noted as the operating limit in FIG. 7), with a direct impact on the comparator response time and an over-sensibility to mismatch. The second effect is a nonlinear discharge of the capacitor $C_{IN}$ due to the polarization regime change of the transistor MN4, however since the reference is autogenerated, this effect remains partially compensated. Thus, depending on OTS selector characteristics as well as array size, careful sizing of the capacitors $C_{IN}$ and $C_{REF}$ is adopted. Finally, it is worth noting, that using body bias options, the threshold of the MOS transistors at the inputs of the comparator 22 can be trimmed to enhance the sense robustness to large sneak-path current for a given sizing.

Figure 8:
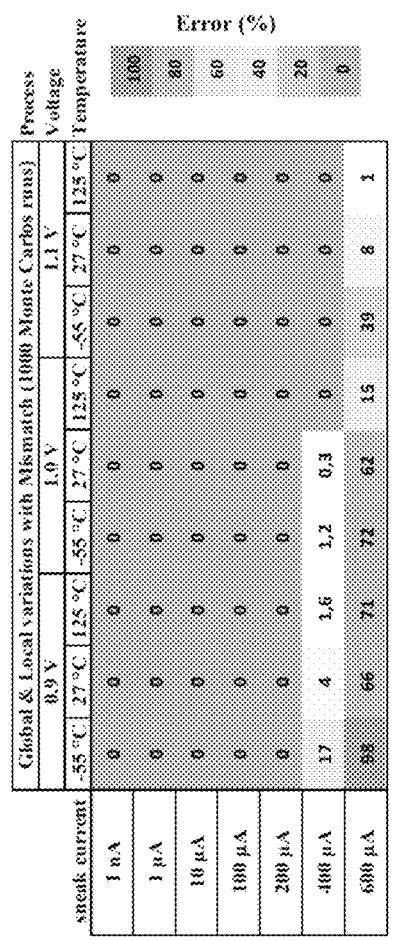
FIG. 8 is a Shmoo plot of the PVT operation of the memory device of FIG. 1 for various sneak-path currents.

Results of the sense amplifier being benchmarked on various sneak-path currents for the 9 predefined corners with Monte Carlo simulations (1000 runs) to include process variations is shown in FIG. 8. FIG. 8 presents a Shmoo plot of the pass/fail sensing results considering the corner cases and the process variation versus different sneak-path current values. The first errors occur for a sneak-path current of 400 µA for the most severe voltage corner case. The errors are mainly due to the low voltage corner (0.9V) since this corner reduces the dynamic across the capacitor, leading to 17% of reading errors. For particularly high sneak-path currents, this design exhibits errors, whatever the corner, meaning that the $C_{IN}$ and $C_{REF}$ sizing is not sufficient to deal with the such an extreme amount of sneak-path current. Besides, for this high sneak-path, the errors are mainly due to voltage corner (0.9V) together with low temperature corner. For the other cases representing a large range of sneak-currents including the targeted one (10 µA), due to the auto-reference generation, the sense amplifier disclosed herein has clearly demonstrated robustness.

Thus, proposed herein is a novel sense amplifier suitable for a phase change memory array utilizing OTS selectors, such as a memory array of 1S1R memory cells. One particular advantage with this sense amplifier design is that it generates, at appropriate times, a self-reference that takes into account the sneak-path current. Thanks to this self-reference generation, the leakage current during the read operation of a 1S1R cell is fully compensated. Moreover, a regulation loop is included to apply a constant reading voltage on the selected cell, whatever the sensing current may be. As explained above, the exceptional robustness this design has been proven through extensive corner case and Monte-Carlo simulations, and thus for a broad range of sneak-path currents, corresponding to various OTS features and/or memory array sizes. This design opens the way for robust memory reading operations in phase change memories using OTS selectors.

The sense amplifier disclosed herein permits subthreshold reading, thereby expanding the lifespan of the 1S1R memory cells by avoiding a destructive reading set following a rewriting set, and expanding the lifespan of the OTS selectors because there is no more set switching.

Although the above sense amplifier has been described with reference to its use with an array of 1S1R memory cells utilizing OTS selectors, it may be applied instead with an array of resistive memory, for example such as resistive random access memory utilizing internal dipole layers to create a built-in electric field. In addition, although the above has been described as utilizing the voltages V and V/2 as a bias strategy, other bias strategies utilizing different fractional voltages may be generated and used other than V/2. For example, the voltages V and V/3 or V/4 may be used as a bias strategy.

Each and every one of references [1]-[20] below are incorporated by reference in their entirety to the maximum extent allowable under the law.

[1] Hang-Ting Lue et al, "3D AND: A 3D Stackable Flash Memory Architecture to Realize High-Density and Fast-Read 3D NOR Flash and Storage-Class Memory", IEEE International Electron Devices Meeting (IEDM), 2020

[2] Hang-Ting Lue et al, "A Vertical 2T NOR (V2T) Architecture to Enable Scaling and Low-Power Solutions for NOR Flash Technology", IEEE Symposium on VLSI Technology,

[3] F. La Rosa et al, "40 nm embedded Select in Trench Memory (eSTM) Technology Overview", IEEE 11th International Memory Workshop (IMW), 2019

[4] M. Carissimi et al, "2-Mb Embedded Phase Change Memory With 16-ns Read Access Time and 5-Mb/s Write Throughput in 90-nm BCD Technology for Automotive Applications", IEEE Solid-State Circuits Letters, vol. 2, no. 9, sep. 2019

[5] G. Navarro et al, "Highly Sb-Rich Ge—Sb—Te Engineering in 4 Kb PhaseChange Memory for High Speed and High Material Stability Under Cycling" IEEE 11th International Memory Workshop (IMW), 2019

[6] E. Nolot et al, "Germanium, antimony, tellurium, their binary and ternary alloys and the impact of nitrogen: An X-ray photoelectron study", Applied Surface Science, vol. 536, January 2021

[7] F. Disegni et al, "Embedded PCM macro for automotive-grade microcontroller in 28 nm FD-SOI", Symposium on VLSI Circuits, 2019

[8] M. Laudato et al, "ALD GeAsSeTe Ovonic Threshold Switch for 3D Stackable Crosspoint Memory" IEEE International Memory Workshop (IMW), 2020

[9] Anthonin Verdy et al, "Improved Electrical Performance Thanks to Sb and N Doping in Se-Rich GeSe-Based OTS Selector Devices", IEEE International Memory Workshop (IMW), 2017

[10] C. Laguna et al, "Innovative Multilayer OTS Selectors for Performance Tuning and Improved Reliability", IEEE International Memory Workshop (IMW), 2020

[11] Solomon Amsalu Chekol et al, "Thermally Stable Te-based Binary OTS Device for Selector Application", Non-Volatile Memory Technology Symposium (NVMTS), 2018

[12] S. R. Ovshinsky, H. Fritzsche, "Amorphous semiconductors for switching, memory, and imaging applications", Transactions on Electron Devices, 1973, vol. 20, issue 2

[13] A. Verdy et al, "Optimized Reading Window for Crossbar Arrays Thanks to Ge—Se—Sb—N-based OTS Selectors", IEEE International Electron Devices Meeting (IEDM), 2018

[14] W. C. Chien et al, "Comprehensive Scaling Study on 3D Cross-Point PCM toward 1Znm Node for SCM Applications", Symposium on VLSI Technology, 2019

[15] Jiwei Li et al, "New write operation scheme for alleviating effect of line resistance on RRAM crossbar array", IEEE Advanced Information Management, Communicates, Electronic and Automation Control Conference (IMCEC), 2016

[16] A. Levisse et al, "SneakPath compensation circuit for programming and read operations in RRAM-based CrosssPoint architectures", 15th NonVolatile Memory Technology Symposium (NVMTS), 2015

[17] Woorham Bae et al, "A Variation-Tolerant, Sneak-Current-Compensated Readout Scheme for Cross-Point Memory Based", IEEE Transactions on Circuits and Systems II: Express Briefs, vol. 65, no. 12, 2018

[18] J. Minguet Lopez et al, "Optimization of RRAM and OTS selector for advanced low voltage CMOS compatibility", IEEE International Memory Workshop (IMW), May 2020, Dresden, Germany. pp. 1-4

[19] Behzad Razavi, "The StrongARM Latch [A Circuit for All Seasons]", IEEE Solid-State Circuits Magazine, vol. 7, no. 2, 2015

[20] G. Lama et al, "Reliability analysis in GeTe and GeSbTe based phasechange memory 4 kb arrays targeting storage class memory applications", Microelectronics Reliability, vol. 114, November 2020

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A sense circuit, comprising:
a regulation circuit having inputs configured to receive an input voltage, a full read voltage from reading of a selected cell of an array of memory cells, and a fractional read voltage applied to unselected cells of the array of memory cells, the regulation circuit comprising:
an input transistor to which a current based upon the input voltage is applied;
a first output transistor in a current mirror arrangement with the input transistor;
a first diode-coupled transistor coupled between the first output transistor and the full read voltage, wherein a regulated voltage is produced at a gate of the first diode-coupled transistor;
a second output transistor in a current mirror arrangement with the input transistor; and
a second diode-coupled transistor coupled between the second output transistor and the fractional read voltage, wherein a regulated fractional voltage is produced at a gate of the second diode-coupled transistor;
wherein the regulated voltage and the regulated fractional voltage are used in reading of the selected cell of the array of memory cells; and
a circuit configured to generate a reference voltage and generate a data output signal based upon a comparison between the reference voltage and the input voltage.

2. The sense circuit of claim 1,
wherein the input transistor comprises a first p-channel transistor having its source coupled to a second supply voltage, and having its drain coupled to its gate and having the current based upon the input voltage sunk therefrom;
wherein the first output transistor comprises a second p-channel transistor having its source coupled to the second supply voltage, its gate coupled to the gate of the first p-channel transistor, and a drain;
wherein the first diode-coupled transistor comprises a first n-channel transistor having its drain coupled to the drain of the second p-channel transistor, its source coupled to the full read voltage, and its gate coupled to its drain and at which the regulated voltage is produced;
wherein the second output transistor comprises a third p-channel transistor having its source coupled to the second supply voltage, its gate coupled to the gate of the first p-channel transistor, and a drain; and
wherein the second diode-coupled transistor comprises a second n-channel transistor having its drain coupled to the drain of the third p-channel transistor, its source coupled to the fractional read voltage, and its gate coupled to its drain and at which the regulated fractional voltage is produced.

3. The sense circuit of claim 2, further comprising:
a third n-channel transistor having its drain coupled to the drain of the first p-channel transistor, its gate receiving a bias signal, and a source; and
a fourth n-channel transistor having its drain coupled to the source of the third n-channel transistor, its source coupled to ground, and its gate coupled to a capacitor circuit to receive the input voltage.

4. A sense circuit, comprising:
a regulation circuit configured to generate a regulated voltage and a regulated fractional voltage for use in reading a selected cell of an array of memory cells;
a capacitor circuit comprising:
a current mirror having an input coupled to a bit line of a selected cell of an array of memory cells and an output coupled to a first node;

a resettable input capacitor circuit coupled between a first supply voltage and the first node to store an input voltage;

a resettable reference capacitor circuit coupled between the first supply voltage and a second node to store a reference voltage; and a transmission gate coupled between the first and second nodes, the transmission gate being controlled by a share control signal; and a circuit configured to generate a data output signal based upon a comparison between the reference voltage and the input voltage.

5. The sense circuit of claim 4, wherein the resettable input capacitor circuit comprises:

an input capacitor coupled between the first supply voltage and the first node to store the input voltage; and an input reset transistor coupled between the first supply voltage and the first node, the input reset transistor being controlled by an input reset control signal.

6. The sense circuit of claim 5, wherein the input capacitor comprises a first MOS transistor having its drain/source terminals connected to the first supply voltage and its gate connected to the first node.

7. The sense circuit of claim 4, wherein the resettable reference capacitor circuit comprises:

a reference capacitor coupled between the first supply voltage and the second node to store the reference voltage; and a reference reset transistor coupled between the first supply voltage and the second node, the reference reset transistor being controlled by a reference reset control signal.

8. The sense circuit of claim 7, wherein the reference capacitor comprises a second MOS transistor having its drain/source terminals connected to the first supply voltage and its gate connected to the second node.

9. The sense circuit of claim 4, wherein the current mirror comprises:

a first n-channel transistor having its drain coupled to the first node, its source coupled to ground, and a gate;

a second n-channel transistor having its drain coupled to the bit line of the selected cell of the array of memory cells, its source coupled to ground, and its gate coupled to its drain and to the gate of the first n-channel transistor; and a third n-channel transistor having its drain coupled to the gates of the first and second n-channel transistors, its source coupled to ground, and its gate coupled to a control signal.

10. A sense circuit, comprising:

a regulation circuit configured to generate a regulated voltage and a regulated fractional voltage for use in reading a selected cell of an array of memory cells;

a circuit configured to generate a reference voltage; and a comparator circuit configured to generate a data output signal based upon a comparison between the reference voltage and an input voltage, the comparator circuit comprising:

a StrongArm comparator having inputs receiving the input voltage and the reference voltage, and generating a positive output and a negative output based upon the comparison between the input voltage and the reference voltage; and an RS flip-flop having a reset input receiving the negative output and a set input receiving the positive output, the RS flip-flop having an output at which the data output signal is generated.

11. The sense circuit of claim 10, wherein the StrongArm comparator comprises:

a first input transistor coupled between a first node and a tail node, the first input transistor having a control terminal controlled by the input voltage;

a second input transistor coupled between a second node and the tail node, the second input transistor having a control terminal controlled by the reference voltage;

a first transistor coupled between a first supply voltage and the positive output, the first transistor having a control terminal coupled to the negative output;

a second transistor coupled between the positive output and the first node, the second transistor having a control terminal coupled to the negative output;

a third transistor coupled between the first supply voltage and the negative output, the third transistor having a control terminal coupled to the positive output; and a fourth transistor coupled between the negative output and the second node, the fourth transistor having a control terminal coupled to the positive output.

12. The sense circuit of claim 11, wherein the first input transistor comprises an n-channel transistor having a drain connected to the first node, a source connected to the tail node, and a gate connected to the input voltage;

wherein the second input transistor comprises an n-channel transistor having a drain connected to the second node, a source connected to the tail node, and a gate connected to the reference voltage;

wherein the first transistor comprises a p-channel transistor having a source connected to the first supply voltage, a drain connected to the positive output, and a gate connected to the negative output;

wherein the second transistor comprises an n-channel transistor having a drain connected to the positive output, a source connected to the first node, and a gate connected to the negative output;

wherein the third transistor comprises a p-channel transistor having a source connected to the first supply voltage, a drain connected to the negative output, and a gate connected to the positive output; and wherein the fourth transistor comprises an n-channel transistor having a drain connected to the negative output, a source connected to the second node, and a gate connected to the positive output.

13. The sense circuit of claim 11, wherein the StrongArm comparator further comprises:

a first enable transistor coupled between a first supply voltage and the positive output, the first enable transistor having a control terminal controlled by an enable signal; and a second enable transistor coupled between the first supply voltage and the negative output, the second enable transistor having a control terminal controlled by the enable signal.

14. A method for operating a sense amplifier in a one-switch one-resistance (1S1R) memory array, comprising:

generating a regulated full voltage and a regulated half voltage from a high voltage;

applying the regulated full voltage to selected bit lines and the regulated half voltage to unselected bit lines of the 1S1R memory array during read operations; and inducing and compensating for sneak-path currents during the read operations by adjusting the applied regulated full voltage and regulated half voltage based on a cell state of an accessed bit cell and an amplitude of the sneak-path current.

15. The method of claim 14, further comprising:
implementing self-reference generation within the sense amplifier via charge sharing between input and reference capacitors;
adjusting voltage on the input capacitor based on a read current of the accessed bit cell and the sneak-path current;
generating a dynamic reference voltage from the reference capacitor after the charge sharing, the dynamic reference voltage being based upon average conditions of the 1S1R memory array, accounting for influences including the sneak-path currents and temperature drift; and
comparing the voltage on the input capacitor, as adjusted, with the dynamic reference voltage to accurately determine data output of the accessed bit cell.

16. The method of claim 14, wherein generating the regulated full voltage from the high voltage is performed using a first transistor and a first amplifier in a voltage regulator arrangement, and wherein generating the regulated half voltage is performed using a second transistor and a second amplifier in a voltage regulator arrangement.

17. The method of claim 14, wherein the regulated full voltage and the regulated half voltage is applied to the selected and unselected bit lines of the 1S1R memory array during the read operations by:
routing the regulated full voltage and the regulated half voltage to a bit line multiplexer with multiple outputs corresponding to different bit lines of the 1S1R memory array;
connecting a first input of the bit line multiplexer to receive the regulated full voltage and a second input to receive the regulated half voltage; and
using a control word from a bit line decoder to control the bit line multiplexer to selectively pass the regulated full voltage to the selected bit line as indicated by the control word, while applying the half voltage to the remaining unselected bit lines, thereby achieving a desired biasing during the read operations.

18. The method of claim 15, wherein the comparison of the voltage on the input capacitor with the dynamic reference voltage is performed using a StrongArm comparator.

* * * * *